United States Patent [19]
Lee

[11] Patent Number: 6,060,357
[45] Date of Patent: May 9, 2000

[54] METHOD OF MANUFACTURING FLASH MEMORY

[75] Inventor: Claymens Lee, Fengshan, Taiwan

[73] Assignee: United Semiconductor Corp., HsinChu, Taiwan

[21] Appl. No.: 09/286,139

[22] Filed: Apr. 5, 1999

[30] Foreign Application Priority Data

Feb. 3, 1999 [TW] Taiwan ................................. 88101626

[51] Int. Cl.[7] ................................................. H01L 21/336
[52] U.S. Cl. ........................ 438/257; 438/257; 438/196; 438/218
[58] Field of Search .................................. 438/257, 262, 438/174, 196, 218, 219, 433, 524, 527; 257/306, 288

[56] References Cited

U.S. PATENT DOCUMENTS

| | | | |
|---|---|---|---|
| 4,698,900 | 10/1987 | Esquivel | 437/52 |
| 5,034,090 | 7/1991 | Fujimura | 156/643 |
| 5,318,921 | 6/1994 | Hsue et al. | 437/52 |
| 5,541,130 | 7/1996 | Ogura et al. | 437/43 |
| 5,795,801 | 8/1998 | Lee | 438/199 |
| 5,817,567 | 10/1998 | Jang et al. | 438/276 |
| 5,882,972 | 3/1999 | Hong et al. | 438/276 |
| 5,892,707 | 2/1999 | Noble | 365/149 |
| 5,982,008 | 11/1999 | Kajiyama | 257/401 |
| 5,994,186 | 11/1999 | Bergemont | 438/257 |
| 5,994,200 | 11/1999 | Kim | 438/425 |

OTHER PUBLICATIONS

Kohyama et al., "Buried Bit–Line Cell for 64Mb DRAMs", 1990 Symposium on BLSI Technology, pp. 17–18.

Kimura et al., "Short–Channel–Effect–Suppressed Sub–0.1–um Grooved–Gate MOSFET's with W Gate", IEEE Trans. on Electron Dev., vol. 42, No. 1 Jan. 1995, pp. 94–100.

Kato et al., "A Shallow–Trench–Isolation Flash Memory Technology with a Source–Bias Programming Method", 1996 IEEE, IEDM 96–177, pp. 7.3.1–7.3.4.

Guillaumot et al., "Flash Eeprom Cells using Shallow Trench Isolation", 1996 Int'l NonVolatile Memory Technology Conf., 1996 IEEE, pp. 74–75.

Primary Examiner—Tom Thomas
Assistant Examiner—L. H Malsawma
Attorney, Agent, or Firm—J. C. Patents; Jiawei Huang

[57] ABSTRACT

A method for manufacturing a flash memory with a shallow trench isolation and a buried bit line. In the invention, the shallow trench isolation is used as an isolation region, so that the size of the devices can be greatly reduced and the integration of the devices can be greatly increased. Additionally, the shallow trench isolation is formed in the substrate before the buried bit line implantation step is performed, so that the short channel effect caused by the lateral diffusion of the doped ions can be eliminated. Moreover, since the neighboring doped regions are electrically coupled to each other through the polysilicon layer, the access rate of the flash memory can be enhanced.

20 Claims, 7 Drawing Sheets

METHOD OF MANUFACTURING FLASH MEMORY

CROSS-REFERENCE TO RELATED APPLICATION

This application claims the priority benefit of Taiwan application serial no. 88101626, filed Feb. 3, 1999, the full disclosure of which is incorporated herein by reference.

BACKGROUND OF THE INVENTION

1. Field of the Invention

The present invention relates to a method of manufacturing a flash memory. More particularly, the present invention relates to a method of manufacturing a flash memory with a shallow trench isolation and a buried bit line.

2. Description of the Related Art

Electrically erasable programmable read-only-memories (EEPROMs) are widely used as memory components for personal computers and electronic equipment. A conventional EEPROM memory cell comprises a floating gate transistor structure that is programmable, erasable and able to store data. The EEPROM device allows data or programs to be erased or written in a bit by bit manner. However, the conventional EEPROM suffers from a slow storage and retrieval time of typically around 150 ns to 200 ns. Recently, a faster EEPROM, such as a flash memory, has been developed having a storage and retrieval time of about 70 ns to 80 ns. By using the flash memory, the data or programs are erased or written in a block by block manner. Only one or two seconds are needed to compete an erasing action. This can save much time and has a lower fabrication cost.

An isolation region is formed in an integrated circuit for the purpose of separating neighboring device regions of a substrate and preventing the carriers from penetrating through the substrate to neighboring devices. Conventionally, the local oxidation of silicon (LOCOS) technique is widely utilized in the semiconductor industry to provide isolation regions among the various devices in the substrate. Since the LOCOS technique has been used for quite a period of time, it is one of the most reliable and low-cost methods for fabricating device isolation region. However, there are still some drawbacks to LOCOS. The drawbacks include internal stress generation and bird's beak encroachment. For a highly integrated device, the problem of bird's beak encroachment by isolation regions is especially difficult to avoid; thus the isolation regions cannot effectively isolate devices. Additionally, the conventional method for forming a buried bit line is to form a doped region for a bit line by an implantation step before the isolation region is formed. However, when the subsequent thermal process, such as formation of the oxide layer and liner oxide layer and the densification step, is performed, the lateral diffusion of the doped region will occur. Therefore, the short channel effect happens.

SUMMARY OF THE INVENTION

The invention provides a method of manufacturing a flash memory with a shallow trench isolation and a buried bit line. By using the invention, the size of the devices can be greatly reduced and the integration of the devices can be greatly increased. Furthermore, the problem of the short channel effect can be overcome.

To achieve these and other advantages and in accordance with the purpose of the invention, as embodied and broadly described herein, the invention provides a method of manufacturing a flash memory cell. A substrate having a pad oxide layer and a mask layer is provided. A shallow trench isolation is formed to penetrate through the mask layer and the pad oxide layer and into the substrate. A patterned photoresist is formed over the substrate. A first opening and a second opening are respectively formed in the shallow trench isolation and the mask layer exposed by the patterned photoresist, wherein the second opening exposes the pad oxide layer and the first and the second openings are adjacent to each other. A buried bit line implantation step is performed to form a doped region in the substrate under the pad oxide layer exposed by the second opening. The patterned photoresist and the mask layer are removed. The first opening is filled with a polysilicon material. The pad oxide layer is removed. A floating gate and a controlling gate are formed over the substrate wherein a portion of the floating gate is on the gate oxide layer above the doped region. By using the invention, the size of the devices can be greatly reduced and the integration of the devices can be greatly increased. Additionally, the short channel effect caused by the lateral diffusion of the doped ions can be eliminated. Moreover, the resistance of the buried bit line formed by the invention is lower than that of the conventional buried bit line. Hence, the access rate of the flash memory can be enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 4:
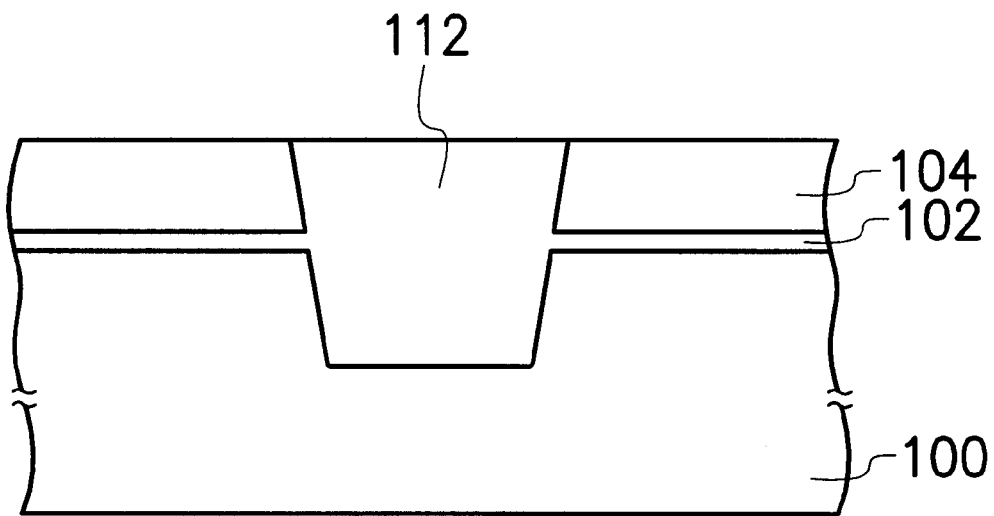
Figure 4A:
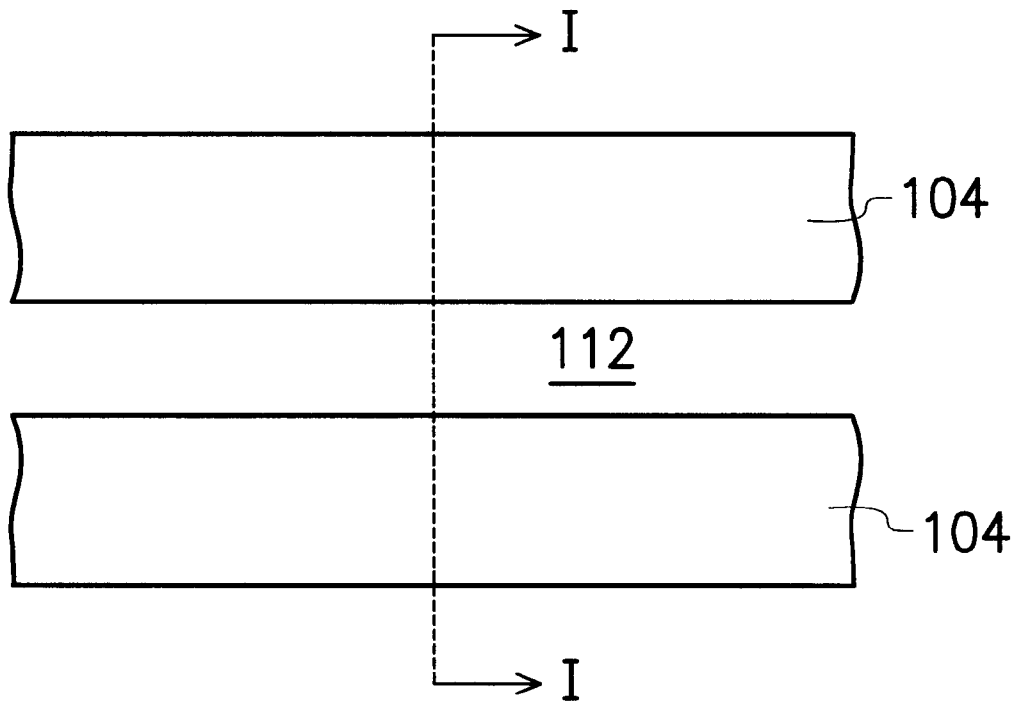
Figure 5:
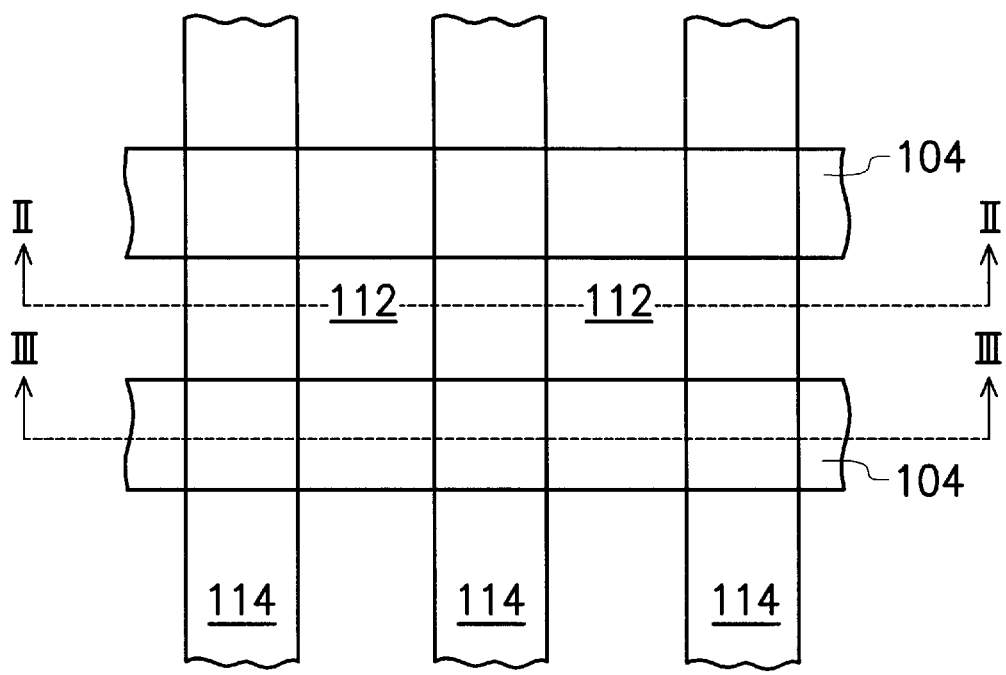
Figure 9A:
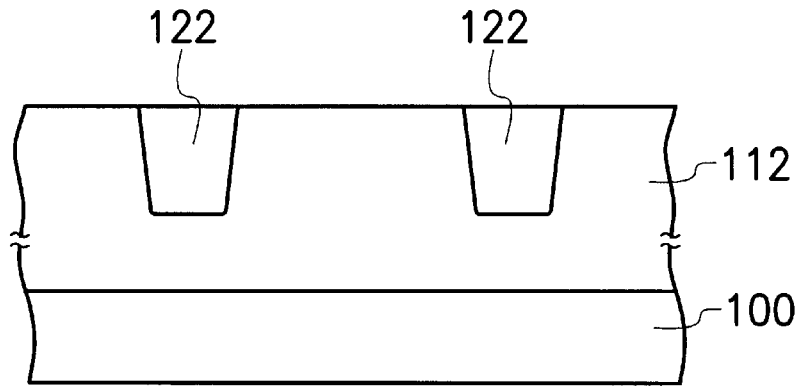
Figure 9B:
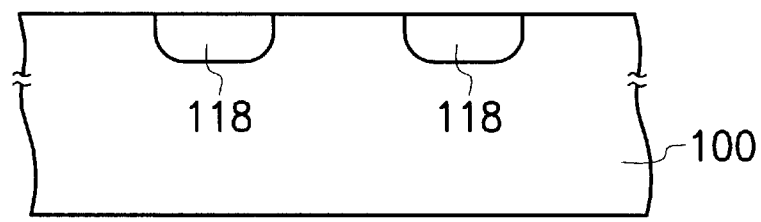
Figure 9C:
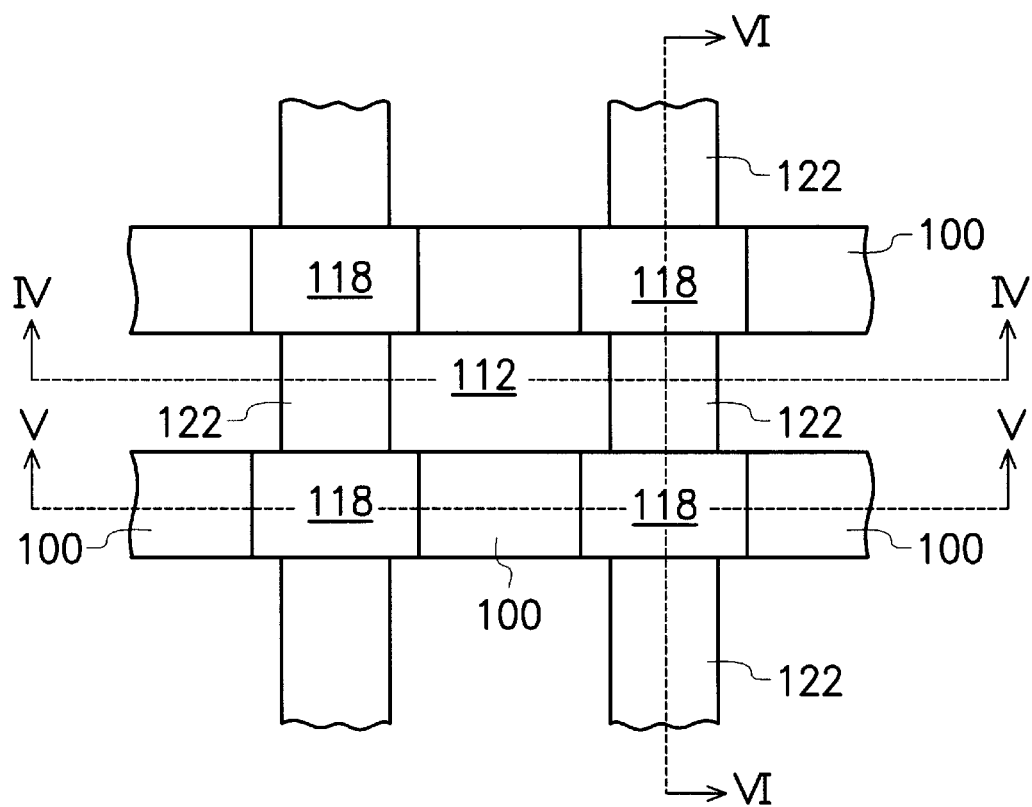
Figure 9D:
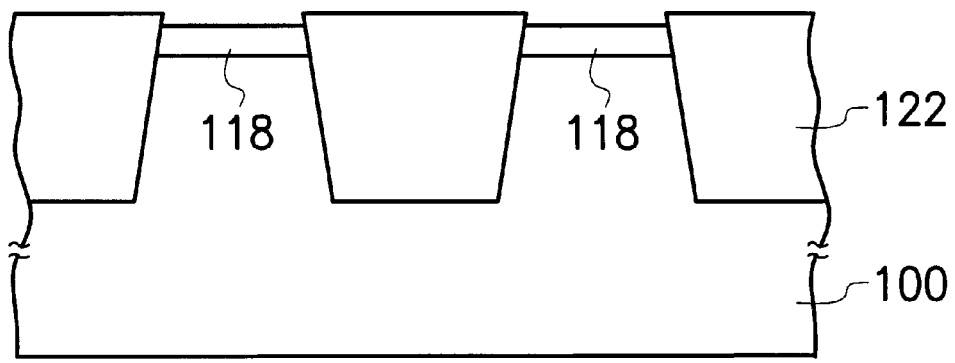

the top view of FIG. 4 is denoted as FIG. 4A and the cross-sectional view taken along the line I—I in FIG. 4A is denoted as FIG. 4;

FIGS. 6A through 9A are schematic, cross-sectional views taken along the line II—II in FIG. 5;

FIGS. 6B through 9B are schematic, cross-sectional views taken along the line III—III in FIG. 5;

the top view of FIG. 9A together with FIG. 9B are denoted as FIG. 9C;

the cross-sectional view taken along the line IV—IV in FIG. 9C is denoted as FIG. 9A;

the cross-sectional view taken along the line V—V in FIG. 9C is denoted as FIG. 9B; and the cross-sectional view taken along the line VI—VI in FIG. 9C is denoted as FIG. 9D.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 1 through 11 are schematic, cross-sectional views of the process for manufacturing a flash memory cell having a shallow trench isolation and a buried bit line in a preferred embodiment according to the invention.

Figure 1:
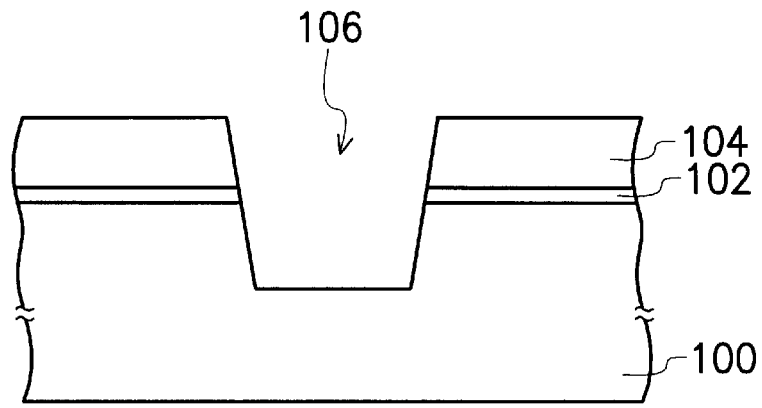
FIGS. 1 through 11 are schematic, cross-sectional views of a process for manufacturing a flash memory cell having a shallow trench isolation and a buried bit line in a preferred embodiment according to the invention.

As shown in FIG. 1, a substrate 100 having a pad oxide layer 102 and a mask layer 104 formed thereon is provided. The pad oxide layer 102 can be formed by thermal oxidation, for example, and preferably, the thickness of the pad oxide layer 102 is about 110 angstroms. The pad oxide layer 102 is used to protect the substrate 100 from damage caused by the subsequent etching process. The mask layer 104 can be formed from silicon nitride by chemical vapor deposition (CVD), for example. Preferably, the thickness of the mask layer 104 is about 1500 angstroms. It should be noted that the thickness of the pad oxide layer 102 and the mask layer 104 is not limited to the preferred thickness given above. The mask layer 104, the pad oxide layer 102 and the substrate are patterned to form a shallow trench 106 penetrating through the mask layer 104 and the pad oxide layer 102 and into the substrate 100.

Figure 2:
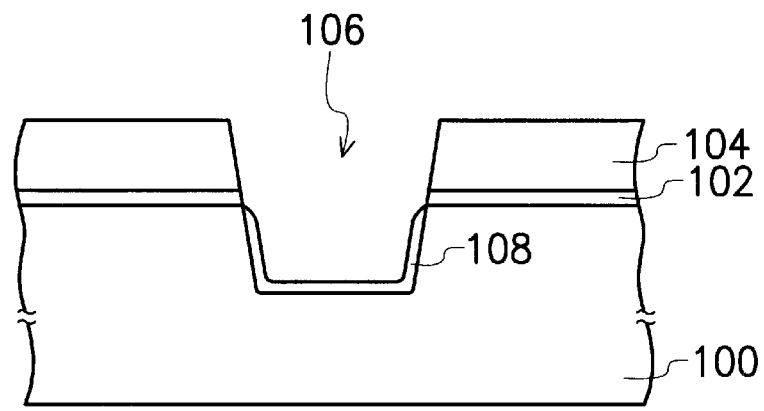

As shown in FIG. 2, a liner oxide layer 108 is formed on the portion of the substrate 100 which is exposed by the shallow trench 106. The liner oxide layer 108 can be formed by thermal oxidation at a temperature of about 1000° C, for example. Preferably, the thickness of the liner oxide layer is about 500 angstroms although other thickness is also applicable.

Figure 3:
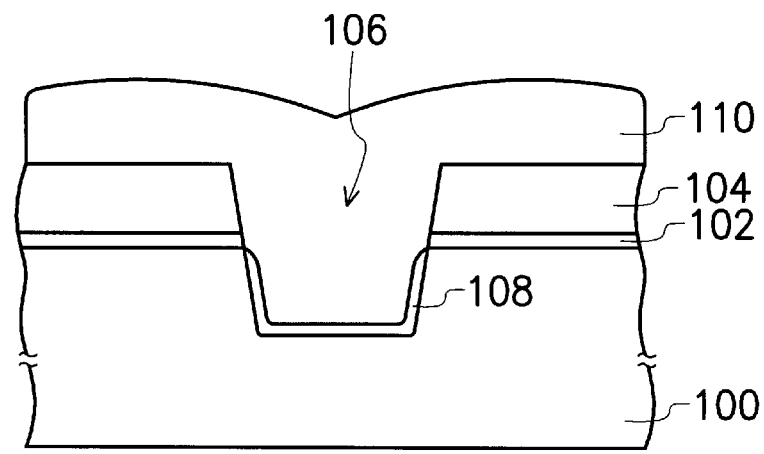

As shown in FIG. 3, an insulating layer 110 is formed on the mask layer 104 and fills the shallow trench 106. The insulating layer 10 can be formed from silicon oxide by atmospheric pressure chemical vapor deposition (APCVD) with tetraethosiloxane (TEOS) gas source. A densification step is performed to consolidate the insulating layer 110. Without the densification step, ions would penetrate through the isolation region during the ion implantation step, and leakage would occur. However, since the densification step is used to increase the density of the insulating layer 110, the insulating layer 110 treated by the densification step can protect the devices from leakage caused by a subsequent ion implantation step. The densification step can be performed at about 1000° C. for 10–30 minutes, for example.

The top view of FIG. 4 is denoted as FIG. 4A and the cross-sectional view taken along the line I—I in FIG. 4A is denoted as FIG. 4. Referring to FIG. 4 together with FIG. 4A, a portion of the insulating layer 110 is removed to expose the mask layer 104. The remaining insulating layer 110 and the liner oxide layer 108 together form a shallow trench isolation 112. The method of removing the portion of the insulating layer 110 can be chemical-mechanical polishing (CMP), for example. As shown in FIG. 4A, the neighboring mask layers 104 are separated by the shallow trench isolation 112 and the mask layers 104 are parallel with each other.

As shown in FIG. 5, a patterned photoresist 114 is formed in a plane over the substrate 100 and the plane is parallel with the substrate 100. The patterned photoresist 114 lies at substantially right angles across the mask layer 104 and the shallow trench isolation 112 and.

FIGS. 6A through 9A are schematic, cross-sectional views taken along the line II—II in FIG. 5. FIGS. 6B through 9B are schematic, cross-sectional views taken along the line III—III in FIG. 5. The process shown in FIGS. 6A through 9A and in FIGS. 6B through 9B is based on the structure shown in FIG. 5.

Figure 6A:
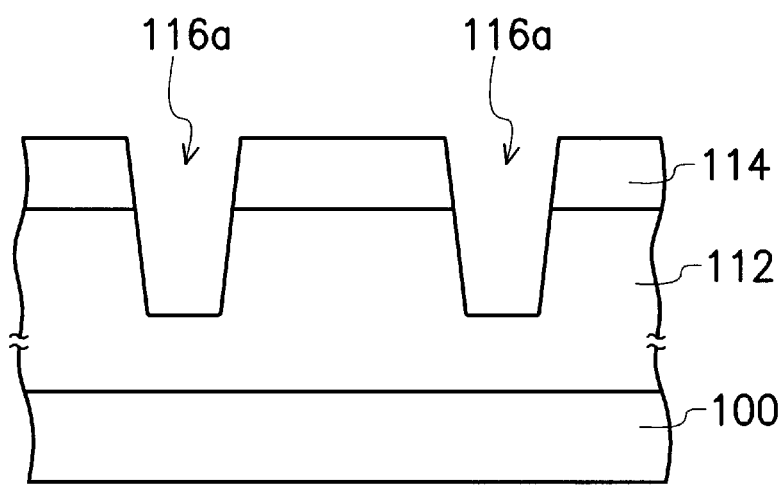
Figure 6B:
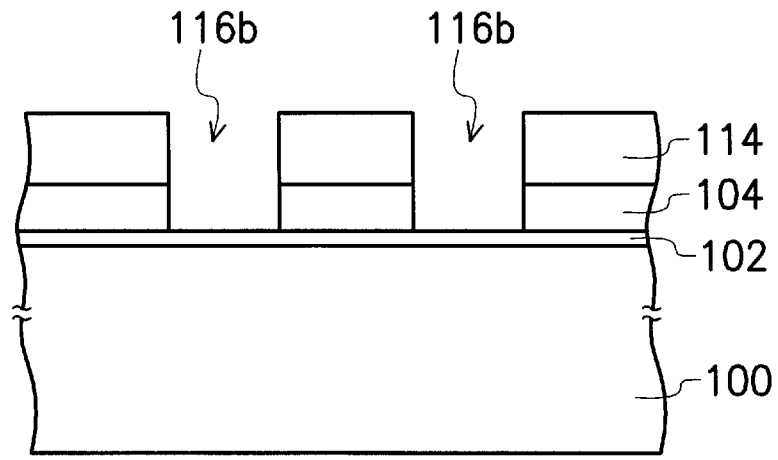

Referring to FIG. 6A together with FIG. 6B, an opening 116a (as shown in FIG. 6A) is formed in the shallow trench isolation 112 by using the patterned photoresist 114 as an etching mask. Simultaneously, an opening 116b (as shown in FIG. 6B) is formed to penetrate through the mask layer 104 by using the pad oxide layer 102 as an etching stop point. In one embodiment, the depth of the opening 116a is about 4000 angstroms. In this example, the opening 116a does not penetrate through the shallow trench isolation 112, but in application, the opening 116a can penetrate through the shallow trench isolation 112 to expose the substrate 100 under the shallow trench isolation 112.

Figure 7A:
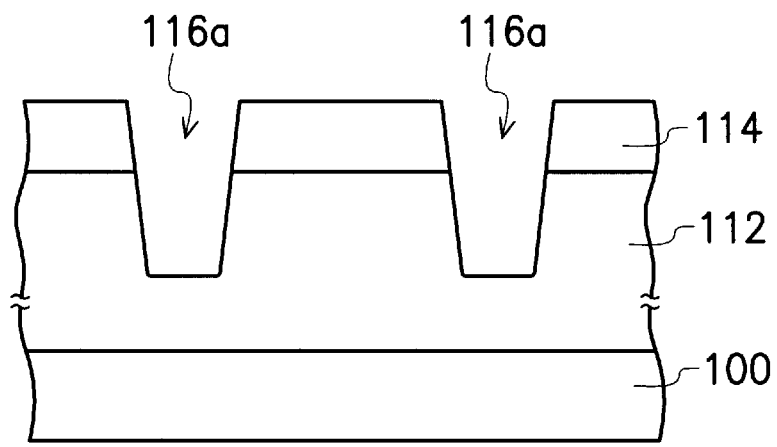
Figure 7B:
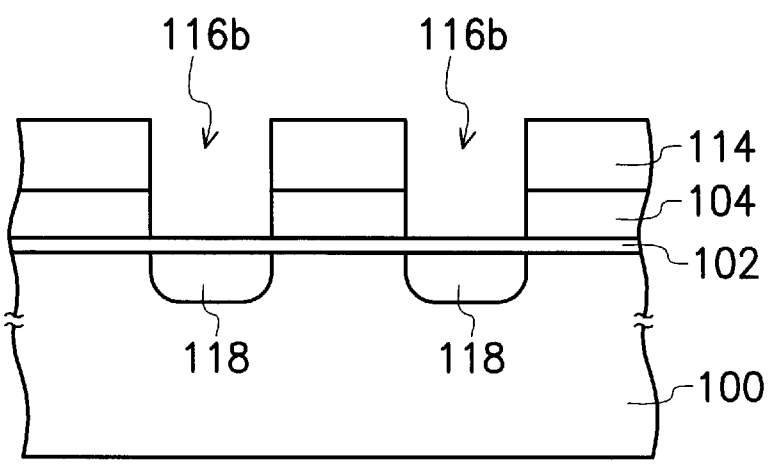

Referring to FIG. 7A together with FIG. 7B, a buried bit line implantation step is performed to form a doped region 118 (as shown in FIG. 7B) in the substrate 100 under the pad oxide layer 102 exposed by the opening 116b. The ions used in the buried bit line implantation step can be arsenic ions, for example. Since the shallow trench isolation 112 is formed from insulating material, it is unable to form a doped region such as the doped region 118 in the shallow trench isolation 112 by performing the buried bit line implantation step. Therefore, FIG. 7A is the same as FIG. 6A.

Figure 8A:
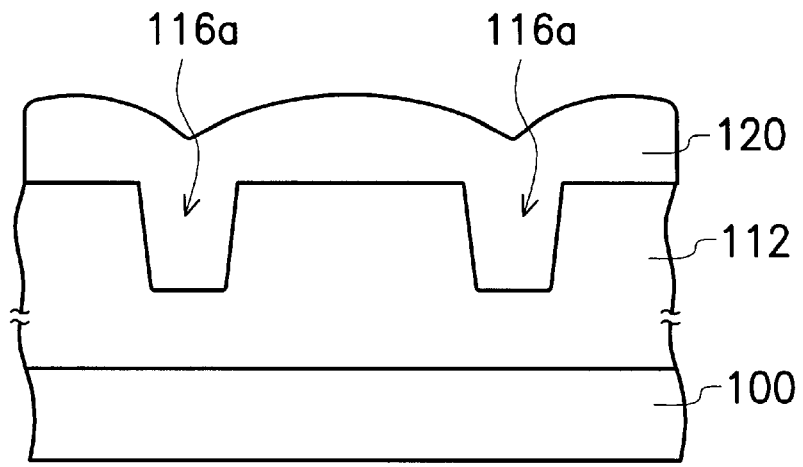
Figure 8B:
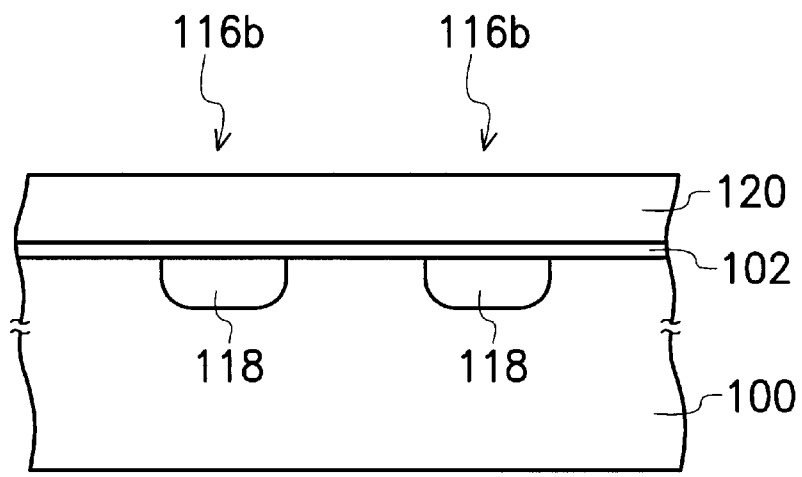

Referring to FIG. 8A together with FIG. 8B, the patterned photoresist 114 and the mask layer 104 are removed in sequence until the pad oxide layer 102 and the shallow trench isolation 112 are exposed. The method of removing the photoresist 114 can be wet etching and the method of removing the mask layer 104 can be wet etching, for example. A polysilicon layer 120 is formed over the substrate 100 and the pad oxide layer 102 and fills the opening 116a (as shown in FIGS. 8A and 8B). The method of forming the polysilicon layer 120 can be in-situ deposition process, for example. The top view of FIG. 9A together with FIG. 9B is denoted as FIG. 9C. The cross-sectional view taken along the line IV—IV in FIG. 9C is denoted as FIG. 9A. The cross-sectional view taken along the line V—V in FIG. 9C is denoted as FIG. 9B. Referring to FIG. 9A together with FIG. 9B and FIG. 9C, a portion of the polysilicon layer 120 is removed to expose the pad oxide layer 102 (as shown in 8B) and the shallow trench isolation 112 to form a polysilicon layer 122 (as shown in FIGS. 9A and 9C). The method of removing the portion of the polysilicon layer 120 can be dry etching, for example. The pad oxide layer 102 is removed to expose the substrate 100 (as shown in FIG. 9B) to finish the process for manufacturing the buried bit line.

The cross-sectional view taken along the line VI—VI in FIG. 9C is denoted as FIG. 9D. Referring to FIG. 9C together with FIG. 9D, the neighboring doped regions 118 are electrically coupled to each other through the polysilicon layer 122 so that a buried bit line of alternating polysilicon layers and doped regions is formed. Since the neighboring doped regions 118 are electrically coupled to each other through the polysilicon layer 122, the resistance of the buried bit line formed by the invention is lower than that of the conventional buried bit line. Hence, the access rate of the flash memory can be enhanced. Incidentally, in the invention, the shallow trench isolation 112 is formed in the substrate 100 before the buried bit line implantation step is performed, so that the ions in the doped region 118 cannot laterally diffuse due to a thermal process in the process for manufacturing the shallow trench isolation (such as the formation of liner oxide layer 108 and the densification step). Therefore, the short channel effect caused by the lateral diffusion of the doped ions can be eliminated.

Figure 10:
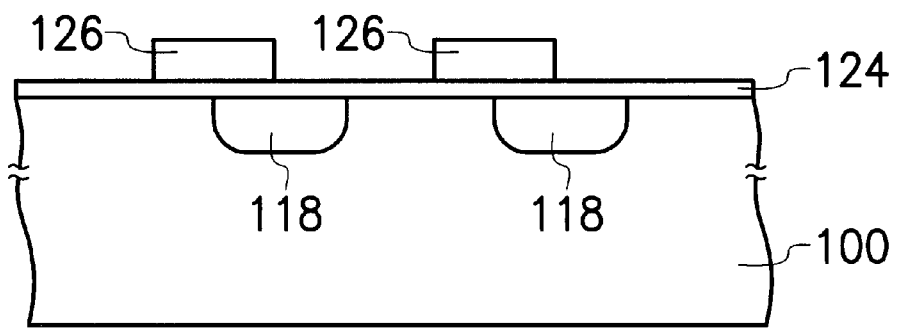

The following steps used to form a flash memory cell are based on FIG. 9B. As shown in FIG. 10, a gate oxide layer 124 is formed over the substrate 100. A patterned polysilicon layer 126 is formed on the gate oxide layer 124. A portion of the patterned polysilicon layer 126 is formed on the gate oxide layer 124 above the doped region 118.

Figure 11:
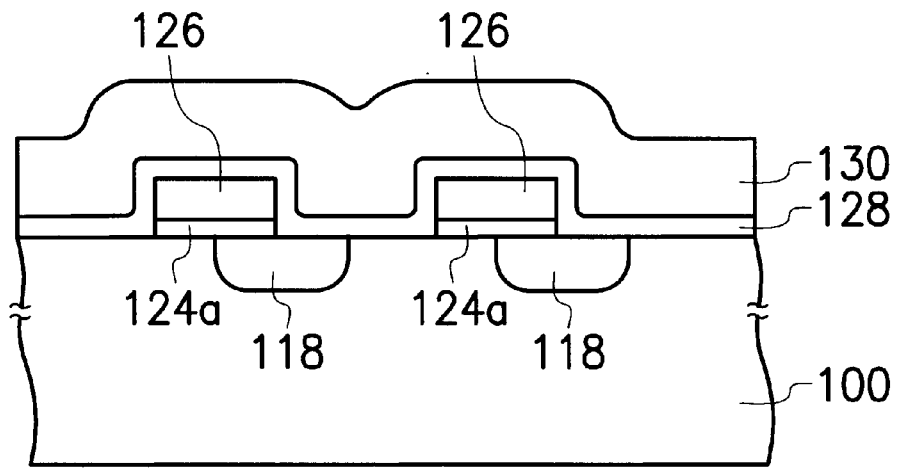

As shown in FIG. 11, a portion of the gate oxide layer 124 is removed by using the polysilicon layer 126 as a mask. The remaining gate oxide layer 124 under the patterned polysilicon layer 126 is denoted as gate oxide layer 124a. An insulating layer 128 is formed over the substrate 100. The insulating layer 128 can be a silicon oxide layer, for example, and the insulating layer 128 is thicker than the gate oxide layer 124a. A polysilicon layer 130 is formed on the insulating layer 128. The polysilicon layer 130, the insulating layer 128 and the polysilicon layer 26 are patterned to form a controlling gate and a floating gate.

The method for manufacturing the shallow trench isolation, the controlling gate and the floating gate used in the invention is one of the methods for manufacturing the shallow trench isolation, the controlling gate and the floating gate. In application, the shallow trench isolation, the controlling gate and the floating gate in the invention can be formed by other proper methods.

In the invention, the shallow trench isolation is used as an isolation region, so that the size of the devices can be greatly reduced and the integration of the devices can be greatly increased. Additionally, the shallow trench isolation is formed in the substrate before the buried bit line implantation step is performed, so that the ions in the doped region can not laterally diffuse due to a thermal process in the process for manufacturing the shallow trench isolation. Therefore, the short channel effect caused by the lateral diffusion of the doped ions can be eliminated. Moreover, since the neighboring doped regions are electrically coupled to each other through the polysilicon layer, the resistance of the buried bit line formed by the invention is lower than that of the conventional buried bit line. Hence, the access rate of the flash memory can be enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a flash memory cell on a substrate having a pad oxide layer and a mask layer the method comprising steps of:

forming a shallow trench isolation to penetrate through the mask layer and the pad oxide layer and into the substrate;

forming a patterned photoresist over the substrate;

respectively forming a first opening and a second opening in the shallow trench isolation and the mask layer exposed by the patterned photoresist, wherein the second opening exposes the pad oxide layer and the first and the second openings are adjacent to each other;

performing a buried bit line implantation step to form a doped region in the substrate under the pad oxide layer exposed by the second opening;

removing the patterned photoresist;

removing the mask layer;

filling the first opening with a polysilicon material;

removing the pad oxide layer; and forming a floating gate and a controlling gate over the substrate, wherein a portion of the floating gate is on the gate oxide layer above the doped region.

2. The method of claim 1, wherein the step of forming the shallow trench isolation further comprises the steps of:

forming a shallow trench to penetrate through the mask layer and the pad oxide layer and into the substrate;

forming a liner oxide layer on a portion of the substrate exposed by the shallow trench;

forming an insulating layer on the mask layer and filling the shallow trench;

performing a densification step; and removing a portion of the insulating layer to expose the mask layer.

3. The method of claim 2, wherein the step of forming a liner oxide layer includes thermal oxidation at 1000° C.

4. The method of claim 2, wherein the step of forming the insulating layer includes atmospheric pressure chemical vapor deposition with a tetraethosiloxane source gas.

5. The method of claim 2, wherein the densification step is performed at about 1000° C. for 10–30 minutes.

6. The method of claim 2, wherein the step of removing the portion of the insulating layer includes chemical-mechanical polishing.

7. The method of claim 1, wherein the step of forming the floating gate and the controlling gate further comprises steps of:

forming a gate oxide layer over the substrate;

forming a patterned first polysilicon layer on the gate oxide layer, wherein a portion of the patterned first polysilicon layer lies on the gate oxide layer above the doped region;

removing the gate oxide layer exposed by the patterned first polysilicon;

forming an insulating layer over the substrate;

forming a second polysilicon layer on the insulating layer; and patterning the second polysilicon layer, the insulating layer and the patterned first polysilicon layer to form the controlling gate and the floating gate.

8. The method of claim 7, wherein the insulating layer is thicker than the gate oxide layer.

9. The method of claim 1, wherein a depth of the first opening is about 4000 angstroms.

10. The method of claim 1, wherein the first opening exposes the substrate.

11. The method of claim 1, wherein ions used in the buried bit line implantation step includes arsenic ions.

12. The method of claim 1, wherein the step of filling the first opening further comprises the steps of:

performing an in-situ deposition process to form a polysilicon layer over the substrate; and removing a portion of the polysilicon layer to expose the pad oxide layer and the shallow trench isolation.

13. The method of claim 12, wherein the method of removing the portion of the polysilicon layer includes dry etching.

14. The method of claim 1, wherein the polysilicon material electrically couples to the doped region.

15. A method of manufacturing a buried bit line on a substrate having a pad oxide layer and a mask layer, the method comprising steps of:

forming a shallow trench isolation to penetrate through the mask layer and the pad oxide layer and into the substrate;

forming a patterned photoresist over the substrate;

respectively forming a first opening and a second opening in the shallow trench isolation and the mask layer exposed by the patterned photoresist, wherein the second opening exposes the pad oxide layer and the first and the second openings are adjacent to each other;

performing a buried bit line implantation step to form a doped region in the substrate under the pad oxide layer exposed by the second opening;

removing the patterned photoresist;

removing the mask layer; and filling the first opening with a polysilicon material, wherein the polysilicon material electrically couples to the doped region to form the buried bit line.

16. The method of claim 15, wherein the step of forming the shallow trench isolation further comprises steps of:

forming a shallow trench to penetrate through the mask layer and the pad oxide layer and into the substrate;

forming a liner oxide layer on a portion of the substrate exposed by the shallow trench;

forming an insulating layer on the mask layer and filling the shallow trench;

performing a densification step; and removing a portion of the insulating layer to expose the mask layer.

17. The method of claim 15, wherein a depth of the first opening is about 4000 angstroms.

18. The method of claim 15, wherein the first opening exposes the substrate.

19. The method of claim 15, wherein ions used in the buried bit line implantation step includes arsenic ions.

20. The method of claim 15, wherein the step of filling the first opening further comprises steps of:

performing an in-situ deposition process to form a polysilicon layer over the substrate; and removing a portion of the polysilicon layer to expose the pad oxide layer and the shallow trench isolation.

* * * * *